United States Patent [19]

Pickus et al.

[11] 4,088,512
[45] May 9, 1978

[54] QUENCH-AGE METHOD FOR THE FABRICATION OF NIOBIUM-ALUMINUM SUPERCONDUCTORS

[75] Inventors: Milton R. Pickus, Oakland; Robert L. Ciardella, Cardiff, both of Calif.

[73] Assignee: The United States of America as represented by the United States Department of Energy, Washington, D.C.

[21] Appl. No.: 761,022

[22] Filed: Jan. 21, 1977

[51] Int. Cl.² .......................................... H01L 39/00
[52] U.S. Cl. ............................ 148/11.5 F; 148/11.5 A; 148/133; 29/599
[58] Field of Search ............... 29/599; 427/383 D, 62; 148/11.5 F, 11.5 A, 127, 133

[56] References Cited

U.S. PATENT DOCUMENTS

| 3,215,569 | 11/1965 | Kneip et al. | 148/133 |
| 3,243,871 | 4/1966 | Saur | 29/599 |
| 3,728,165 | 4/1973 | Howlett | 148/127 |
| 3,801,378 | 4/1974 | Webb | 148/133 |
| 4,000,014 | 12/1976 | Winter | 148/11.5 R |

OTHER PUBLICATIONS

"1976 Applied Superconductivity Conference, 17-20 Aug. 1976, Stanford University, Stanford, California" E.R.D.A. Brochure pp. 80-83.
Lundin et al. "The Equilibrium Phase Diagram, Niobium-Aluminum" *Trans. Met. Soc. AIME*, vol. 236, Jun. 1966, pp. 863-872.
Ciardella et al. "A Quench-Age Method for the Fabrication of Nb(Al) Superconductors" *IEEE Trans. on Magnetics* vol. MAG-13, No. 1, 1/77, pp. 832-833.
*IEEE Transactions on Magnetics*, vol. MAG 13, No. 1, Jan. 1977, pp. 9, 10.
Eagar et al. "Improved Jc in Mechanically Fabricated Nb₃Al Wires and Ribbons" IEEE MAG-11(2), 214 (1975).
Ceresara et al. "Nb₃Al Formation at Temperatures Lower than 1000° C *IEEE MAG*-11(2), 263 (1975).

Primary Examiner—O. R. Vertiz
Assistant Examiner—Brian E. Hearn
Attorney, Agent, or Firm—Dean E. Carlson; Roger S. Gaither; Irene S. Croft

[57] ABSTRACT

A flexible $Nb_3Al$ superconducting wire is fabricated from a niobium-aluminum composite wire by heating to form a solid solution which is retained at room temperature as a metastable solid solution by quenching. The metastable solid solution is then transformed to the stable superconducting A-15 phase by low temperature aging. The transformation induced by aging can be controlled to yield either a multifilamentary or a solid A-15 core surrounded by ductile niobium.

12 Claims, 5 Drawing Figures

QUENCH-AGE METHOD FOR THE FABRICATION OF NIOBIUM-ALUMINUM SUPERCONDUCTORS

BACKGROUND OF THE INVENTION

The invention described herein was made in the course of, or under, Energy Research and Development Administration Contract W-7405-ENG-48 with the University of California. This invention relates to the fabrication of a functional shaped superconductor from the Nb-Al system. More particularly, this invention relates to the fabrication of a flexible $Nb_3Al$ superconducting composite wire.

The most important property of a superconductor is its ability to develop large magnetic fields with minimal power losses when wound into coils. The most widely used material at present is the ductile NbTi which remains superconducting only in relatively weak magnetic fields, has a low critical temperature (10 K), but is easily processed by conventional techniques. The best superconductors are the extremely brittle A-15 compounds which can develop high magnetic fields at temperatures above 20 K but which demand special fabrication methods.

One of the best known superconductors is the intermetallic compound $Nb_3Al$. The superconducting properties of this compound are such as to make it a possible candidate for large scale applications where high critical fields and high critical current densities are required.

One process for fabricating wire from the Nb-Al system has been suggested by Eagar et al (T. W. Eagar and R. M. Rose, "Improved $J_c$ in Mechanically Fabricated $Nb_3Al$ Wires and Ribbons", IEEE MAG-11 (2), 214, 1975). According to the Eagar et al process a composite of elemental Nb and Al is heat treated to form the A-15 phase by direct conversion from the elemental states. A low temperature ordering anneal is then performed. Although Eagar et al were able to obtain higher values of critical temperature, 18 K, with this high temperature diffusion reaction, they were unable to consistently produce high current carrying capacities.

Ceresara et al (S. Ceresara, M. V. Ricci, N. Sacchetti and G. Sacerdoti, "$Nb_3Al$ Formation at Temperatures Lower Than 1000° C", IEEE MAG-11 (2), 263, 1975) have reported that $Nb_3Al$ has been formed by diffusion at temperatures as low as 750° C. However, the critical temperature was low, 15.5 K. The depression of $T_c$ (critical temperature) is most likely a result of the deviation of the A-15 from stoichiometry. For a diffusion reaction taking place below 1000° C, the A-15 phase region only extends to 19 at .% Al. There is no way to circumvent this limitation for a straightforward diffusion process in this temperature range.

Thus, there is a need for a process which optimizes the potential of the Nb-Al system.

SUMMARY OF THE INVENTION

In brief, the present process for fabricating a functional shaped superconductor from the Nb-Al system is a sequence of a solution treatment at a temperature in the high temperature solid solution region of the Nb-Al phase diagram, rapid quench to form a metastable solid solution of Al in Nb, and a low temperature aging treatment to convert the metastable solid solution to the A-15 phase. The process results in an A-15 core surrounded by a ductile niobium matrix.

An important feature of the invention is the formation of the A-15 phase of $Nb_3Al$ at a relatively low temperature, that is, a temperature below about 1100° C, preferably below about 1000° C. Another important feature of this invention is based on the observation that mechanical twinning is an important mode of deformation of the metastable Nb(Al) solid solution. It has been found that an aging treatment of a previously deformed metastable solid solution results in the formation of the A-15 phase along the twin network. Having the A-15 phase in the form of filaments is well known to be highly desirable for conductor stability. The $Nb_3Al$ superconductor fabricated by the process of the present invention has high values of $T_c$ (critical temperature).

It is, therefore, an object of this invention to provide an improved method for the fabrication of a functional shaped superconductor from the Nb-Al system.

Another object of the invention is to provide an improved method for the fabrication of a multifilamentary $Nb_3Al$ superconductor.

More particularly, it is an object of this invention to provide an improved method for the fabrication of a $Nb_3Al$ superconducting composite wire at a relatively low temperature, specifically, lower than about 1100° C.

Other objects and advantages will become apparent from the following detailed description made with reference to the accompanying drawings.

DETAILED DESCRIPTION OF THE INVENTION

The present process utilizes as the starting material a functional shaped composite, such as a composite wire, of elemental niobium and aluminum in proportions sufficient for subsequent substantial transformation to the intermetallic compound $Nb_3Al$. The unreacted composite is solution heat treated at a temperature in the high temperature solid solution region of the Nb-Al phase diagram, in particular a temperature above about 1600° C and preferably in the range of about 1800°–2000° C, to form a solid solution of Al in Nb surrounded by unreacted niobium. The solution heat treatment is followed by quenching at a rate sufficient to retain the solid solution in a metastable condition and substantially prevent transformation to the stable A-15 phase. The metastable solid solution is then transformed to the superconducting A-15 phase by a low temperature aging treatment, particularly at a temperature below about 1100° C and preferably below about 1000° C.

According to a specific embodiment of the present invention, the metastable solid solution formed upon quenching is subjected to a deformation to produce mechanical twinning prior to the aging treatment. This method of operation results in an A-15 phase in the form of filaments.

Figure 1:
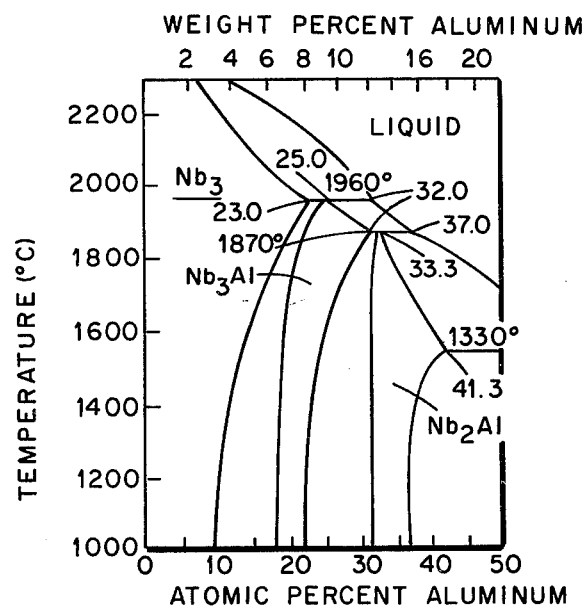
FIG. 1 is a phase diagram of the Nb-Al system.

Referring to FIG. 1, which is a phase diagram of the Nb-Al system, it can be seen that the solubility of Al in Nb increases with increasing temperature, reaching a maximum of about 23 at .% at about 1950° C. Thus, for optimum properties, the solution heat treatment (annealing) step of the present process is carried out at a temperature in the range of about 1900°–2000° C to take advantage of the maximum solubility in this region. Because of the very high interdiffusion coefficients at the elevated temperature, it is necessary to control the duration of the heat treatment to prevent complete diffusion of Al through the Nb with resulting depression of the Al concentration in the Nb(Al) solid solution. For optimum properties, the duration of the annealing step is controlled to provide a core of an Nb(Al) solid solution containing not less than about 18 at .% Al.

Upon rapid quenching, the thus formed solid solution is retained in a metastable condition. Rapid quenching is necessary to retain the high temperature phase formed in the solution heat treatment step. To substantially prevent transformation to the stable A-15 phase during the quenching operation, the quenching rate is preferably at least about 500° C/sec.

Figure 2:
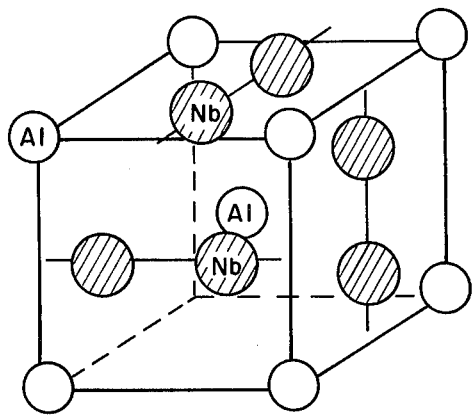
FIG. 2 is a schematic representation of the A-15 phase structure.

As hereinbefore stated, an important feature of the present invention is the formation of the A-15 phase at a relatively low temperature. It is desirable, from the standpoint of the superconducting properties $T_c$ and $J_c$, that the A-15 phase be formed at a temperature below about 1000° C. The critical temperature of $Nb_3Al$ is strongly dependent upon the degree of atomic order of the Nb and Al atoms in the A-15 lattice (illustrated diagrammatically in FIG. 2). This atomic order is destroyed in material formed by high temperature diffusion processes. The critical current carrying capacity of $Nb_3Al$ is dependent upon the amount and efficiency of the magnetic flux pinning centers present in the superconducting phase. Flux pinning centers can be oxides, vacancies or any other type of discontinuity in the structure. Grain boundaries are very effective pinning centers and the smaller the grain size the better is the pinning effect. The grain size of the phase is directly related to the formation temperature; the lower the reaction temperature the smaller is the grain size. A low reaction temperature is especially important in $Nb_3Al$ since the grain size cannot be refined by subsequent heat treatment and no successful process has been developed to introduce a dispersed oxide phase, such as $ZrO_2$, as pinning sites.

In the present fabrication process, a metastable solid solution comprising an Al supersaturated Nb matrix, formed by solution heat treatment and rapid quenching as described above, is transformed to the stable A-15 compound by low temperature (below about 1100° C) aging. The transformation process is dependent upon the composition of the composite and the time and temperature of aging, with lower Al content and lower aging temperature requiring longer aging time for complete transformation.

Figure 4:
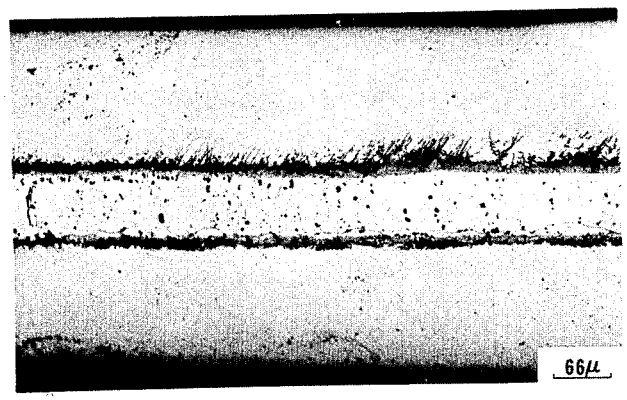
FIG. 4 is a photomicrograph of the $Nb_3Al$ composite wire fabricated by the process of the present invention.
Figure 5:
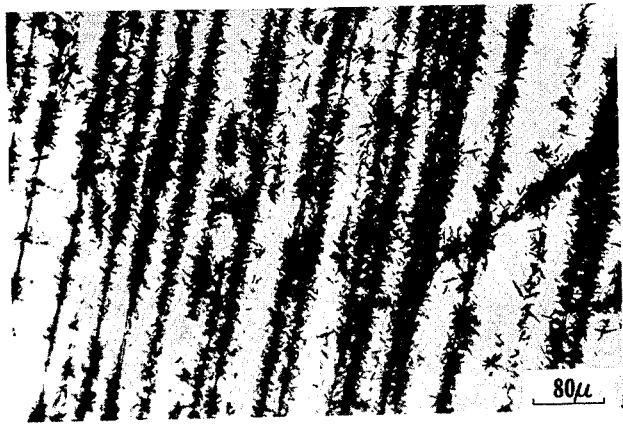
FIG. 5 is a photomicrograph showing the A-15 phase as filaments along the twin network.

In accordance with one embodiment of the present invention, transformation to the A-15 compound is entire to form a solid A-15 core (FIG. 4). In accordance with a second embodiment of the invention, transformation takes place as filaments along preferential sites such as twin bande (FIG. 5).

According to the second embodiment, a multifilamentary core is obtained by subjecting the metastable solid solution formed upon quenching to a relatively minor deformation to produce mechanical twinning prior to the aging treatment. The resulting twin bands are preferential sites for the transformation of the metastable solid solution to the stable A-15 compound. By suitably controlling the conditions of aging (time and temperature) for a specific composition, a multifilamentary composite can be obtained by arresting the transformation process after transformation along the twin network has taken place and before transformation becomes complete. As an illustration, a bulk sample containing 15 at.% Al was solution heat treated at 1950° C, rapidly quenched and then rolled at room temperature. The rolled sample was then aged for 1 hr. at 1000° C. The microstructure of the resulting composite is shown in the photomicrograph of FIG. 5. The precipitation of the A-15 phase along the twin network is clearly shown. For composites with higher Al content, which is preferred from the standpoint of optimum superconducting properties, a lower aging temperature and/or a longer aging time can be used to produce a similar microstructure.

Figure 3:
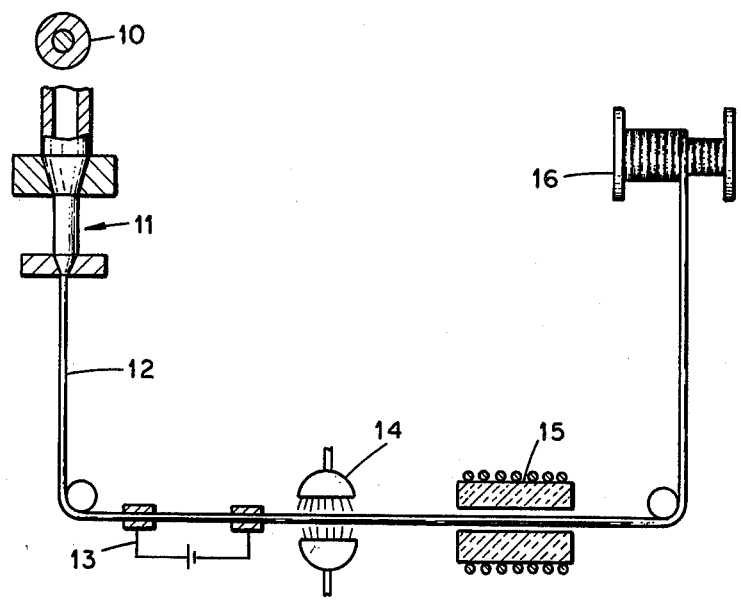
FIG. 3 is a schematic diagram of a preferred mode of operation of the process of the present invention.

A preferred method of fabrication is illustrated in FIG. 3. Referring to FIG. 3, numeral 10 refers to a composite consisting of a niobium tube filled with an aluminum rod. Composite 10 is swaged and wire drawn in mechanical deformation stage 11 to form Nb-Al composite wire 12. Wire 12 is then solution annealed by passage between electrical contacts 13. Direct resistive heating is preferred because (1) the time of reaction can be regulated easily from seconds to minutes as desired with the sample reaching the high temperature very rapidly and (2) the sample is gripped in such a way that the ends of the wire are cooled. This eliminates any possibility of the aluminum escaping from the ends. Solution reaction time depends upon the initial Nb and Al core size. Subsequent to the solution annealing step, a jet of a high pressure gas such as helium is directed on wire 12 from a quenching set-up 14. The quenched wire is then aged in oven 15 at a temperature of less than about 1000° C for a period of time sufficient to substantially transform the metastable solid solution formed upon quenching to the stable A-15 phase. The finished wire is then wound on coil 16.

The wire formed by the above-described process consists of a large $Nb_3Al$ core is a ductile Nb matrix. This process can be adapted to multifilamentary composites by well-known and commercially used methods. For example, the starting material can be a large cylindrical block of niobium in which a plurality of holes have been drilled. Each hole is filled with an Al rod. The resulting composite is then treated as shown in FIG. 3. The resulting wire is then used as the filler material in another drilled Nb cylindrical block and the process is repeated. By such a repetitive type process a multifilamentary core can be obtained. However, this kind of a process is very tedious and time consuming.

In accordance with the second embodiment of the invention as hereinbefore described, a multifilamentary composite can be obtained much more simply by modifying the system shown in FIg. 3 to include a mild deformation step between quenching set-up 14 and aging oven 15. For example, after the quenching step, wire 12 can be subjected to relatively minor wire drawing, of only a few percent so that the diameter of the wire is not substantially changed, to produce mechanical twinning. The thus deformed wire is then aged under conditions as described above to produce a multifilamentary composite core.

The present invention is illustrated by the following example.

EXAMPLE

Niobium tubing with O.D. = 5.8 mm and I.D. = 0.95 mm was filled with 0.93 mm Al rod using 2011-T3 Al which contains a small percentage of copper. The composite was swaged down to 1.88 mm and wire drawn to 0.5 mm. The composite wire was reacted for 30 sec at a temperature of about 1950° C and then quenched by a jet of high pressure helium gas. The quenched wire was then aged for 1 hr. at 1000° C.

Two additional samples were prepared by the same method described above but under different aging conditions; one was aged for 18 hr. at 950° C and the other was aged for 24 hr. at 900° C.

The critical temperature of the three samples were measured inductively through the cooperation of Dr. R. Hammond and the Stanford University Department of Applied Physics. The onset of superconductivity for the samples was 17.6 ± 0.5 K with a transition width of about 1.0 K. There was a 100° C aging temperature difference between the samples but no detectable difference in $T_c$ was noticed.

This value of $T_c$ is a full 2 K higher than has been reported for samples prepared by diffusion at temperatures below 1000° C. Comparing the values of $T_c$ reported by Kohr et al (J. G. Kohr, T. W. Eagar and R. M. Rose, *Met. Trans.* 3, 1177, May 1972), the measured $T_c$ in the samples corresponds to that of an A-15 with about 21 at.% Al. This was actually the composition determined by previous microprobe analysis. This consistency suggests that the material formed at a temperature below 1000° C is well ordered.

A photomicrograph of the final wire microstructure is shown in FIG. 4 and indicates that a large Nb$_3$Al core is formed in a ductile Nb matrix.

The fabrication method of the present invention has two important advantages resulting from the formation of a metastable solid solution: 1. the critical current densities can be expected to be high since the A-15 formation temperature is low; 2. it is possible to cable the asquenched solid solution with copper prior to forming the A-15 phase. This is possible since the solid solution can withstand plastic deformation without disturbing the continuity of the reaction layer, and the subsequent aging temperature is below the melting point of copper. Additionally, the cabling operation can provide the mild deformation necessary to induce mechanical twinning for the formation of a multifilamentary core as hereinbefore described.

Thus, it has been shown that the process of the present invention provides a flexible, Nb$_3$Al conductor with high superconducting properties.

Although the invention has been described with respect to a specific embodiment, it will be appreciated that various modifications and changes may be made therein without departing from the true spirit and scope of the invention, and thus it is not intended to limit the invention except by the terms of the following claims.

What we claim is

1. A method for producing a functional shaped niobium-aluminum composite superconductor comprising Nb$_3$Al in the A-15 phase, which method comprises:

heat treating a functional shaped composite of elemental niobium and aluminum at a temperature in the high temperature solid solution region of the Nb-Al phase diagram such that a metastable solid solution of Al in Nb is formed upon subsequent quenching;

quenching the heat treated composite at a rate sufficient to form a metastable solid solution of Al in Nb and substantially prevent transformation to the A-15 phase; and transforming the metastable solid solution to the A-15 phase by low temperature aging.

2. A method according to claim 1 wherein the functional shaped composite is a composite wire.

3. A method according to claim 2 wherein the composite wire of elemental niobium and aluminum is fabricated by mechanical deformation of a niobium tube filled with an aluminum rod.

4. A method according to claim 1 wherein the heat treatment is carried out at a temperature above about 1600° C.

5. A method according to claim 4 wherein the heat treatment is carried out at a temperature in the range of about 1900° C to about 2000° C.

6. A method according to claim 5 wherein the heat treatment is carried out at a temperature of about 1950° C.

7. A method according to claim 1 wherein the quenching rate is at least about 500° C/sec.

8. A method according to claim 7 wherein the quenching is carried out by directing a jet of high pressure gas on the heat treated composite.

9. A method according to claim 1 wherein the transformation of the metastable solid solution to the A-15 phase is carried out by aging at a temperature of less than about 1100° C.

10. A method according to claim 9 wherein the aging temperature is below about 1000° C.

11. A method according to claim 1 wherein the metastable solid solution is deformed to produce mechanical twinning prior to the aging treatment.

12. A method according to claim 11 wherein the transformation of the deformed metastable solid solution is controlled to produce a multifilamentary structure.

* * * * *